United States Patent
Lin et al.

(10) Patent No.: US 8,773,930 B2
(45) Date of Patent: Jul. 8, 2014

(54) BUILT-IN TEST CIRCUIT AND METHOD

(75) Inventors: Tzu-Kuei Lin, Chu-Pai (TW);
Hung-Jen Liao, Hsin-Chu (TW);
Yen-Huei Chen, Jhudong Township (TW); Fang Jao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 204 days.

(21) Appl. No.: 13/365,631

(22) Filed: Feb. 3, 2012

(65) Prior Publication Data
US 2013/0201776 A1    Aug. 8, 2013

(51) Int. Cl.
*G11C 29/00*    (2006.01)

(52) U.S. Cl.
USPC ..................... 365/201; 365/185.22

(58) Field of Classification Search
CPC ..... G11C 29/10; G11C 11/4087; G11C 29/14
USPC ........................... 365/201, 185.22
See application file for complete search history.

(56) References Cited

U.S. PATENT DOCUMENTS

| | | | | |
|---|---|---|---|---|
| 7,453,731 | B2* | 11/2008 | Tu et al. | 365/185.18 |
| 7,558,120 | B2* | 7/2009 | Takai | 365/185.22 |
| 7,940,585 | B2 | 5/2011 | Chun et al. | |

OTHER PUBLICATIONS

D'Agostino, F. et al., Introduction to VLSI Design (EECS 467), Project—Short Channel Effects in MOSFETs, Dec. 11, 2000, pp. 1-15.
"High Temperature Operating Life (HTOL) Test", retrieved from: http://www.siliconfareast.com/HTOL.htm, 3 pages.

* cited by examiner

*Primary Examiner* — Son Dinh
*Assistant Examiner* — Nam Nguyen
(74) *Attorney, Agent, or Firm* — Duane Morris LLP

(57) ABSTRACT

A method of testing a semiconductor memory includes performing a first test of a first type prior to packaging the semiconductor memory. The first test of the first type includes generating a first plurality of addresses, decoding the first plurality of addresses to generate a second plurality of decoded addresses at a first decoder, and activating one of a plurality of rows or a plurality of columns of the semiconductor memory based on the second plurality of decoded addresses. The semiconductor memory is packaged after performing the first test of the first type.

20 Claims, 3 Drawing Sheets

BUILT-IN TEST CIRCUIT AND METHOD

TECHNICAL FIELD

The embodiments described herein relate to semiconductor integrated circuits, and, more particularly, to testing a semiconductor memory using a stress test circuit.

BACKGROUND OF THE INVENTION

Semiconductor memories are tested at various stages of processing. Once a conventional semiconductor memory has been packaged, a burn-in stress test is performed. However, performing burn-in stress tests once the semiconductor memory is packaged is a time-consuming process.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
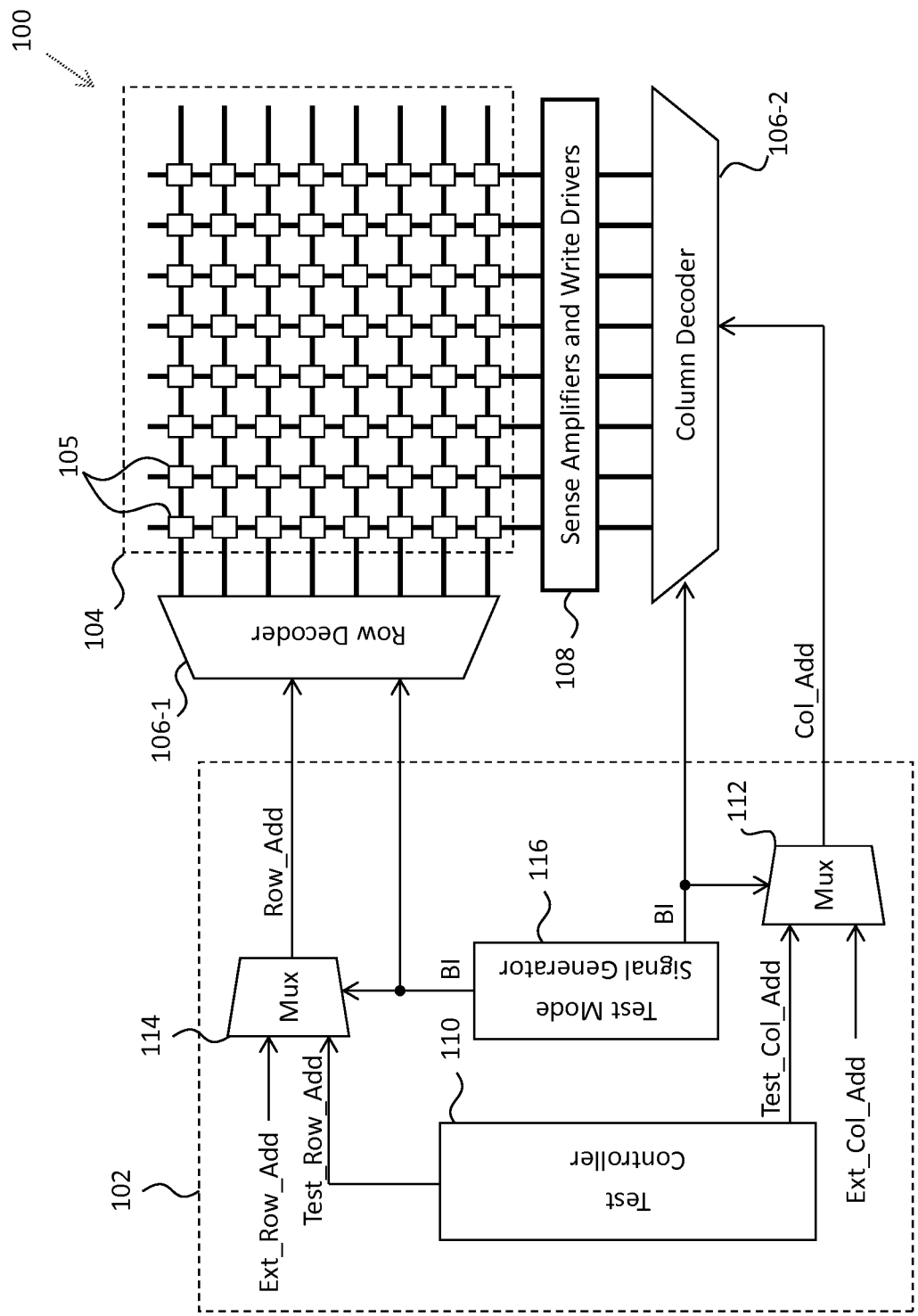
FIG. 1 is a functional block diagram of one example of an improved semiconductor memory configured with a built-in test circuit for performing a wafer burn-in stress test.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 illustrates on example of a semiconductor memory 100 including a built-in test circuit 102. Semiconductor memory includes an array 104 of memory cells 105 disposed in rows and columns. As will be understood by one skilled in the art, the turning on and off of the memory cells 105 is controlled by a row decoder 106-1 and a column decoder 106-2. For example, row decoder 106-1 is configured to selectively activate one or more rows, e.g., word lines, of array 104 in response to receiving a row address signal, Row_Address, and column decoder 106-2 is configured to selectively activate one or more columns, e.g., bit lines, of array 104 in response to receive a column address signal, Col_Add. Block 108 includes sense amplifiers and write drivers configured to read data from and write data to the memory cells 105.

Built-in test circuit 102 includes a controller 110 coupled to a first multiplexer ("mux") 112 and to a second mux 114, which are respectively coupled to row decoder 106-1 and to column decoder 106-2. A test mode signal generator 116 is also coupled to muxes 112, 114, to row decoder 106-1, and to column decoder 106-2.

Controller 110 is configured to generate a test column address signal, Test_Col_Add, which controller 110 provides to mux 112. The Test_Col_Add signal may be a pre-stored series of addresses or randomly generated addresses to be tested during a burn-in stress test described below. Controller 110 also generates a test row address signal, Test_Row_Add, which controller 110 provides to mux 114.

Mux 114 receives the Test_Col_Add signal from controller 110, an external column address, Ext_Col_Add, from an external circuit (not shown), and a burn-in test signal, BI, from test mode signal generator 116. Mux 112 outputs Col_Add signal to column decoder 106-2 based on the Ext_Col_Add during a normal memory operation, e.g., a read, write, or refresh operation. During a burn-in test, the Col_Add signal is output from mux 112 based on the Test_Col_Add signal received from controller 110. In some embodiments, test mode signal generator 116 provides a test control signal, BI, which identifies if semiconductor memory 100 is in a test mode, or if semiconductor memory 100 is in a normal operating mode.

Mux 114 receives an external row address signal, Ext_Row_Add, from an external circuit (not shown), the burn-in test signal, BI, from test mode signal generator 116, and the Test_Row_Add from controller 112. The Row_Add signal output from mux 114 to row decoder 106-1 is based on the Ext_Row_Add signal during a normal memory operation, e.g., a read, write, or refresh operation. During a test, the Row_Add output by mux 114 is based on the Test_Row_Add signal received from controller 110. As described above, test mode signal generator 116 provides the test control signal, BI, which identifies if semiconductor memory 100 is in a test mode, or if semiconductor memory 100 is in a normal operating mode.

Figure 2:
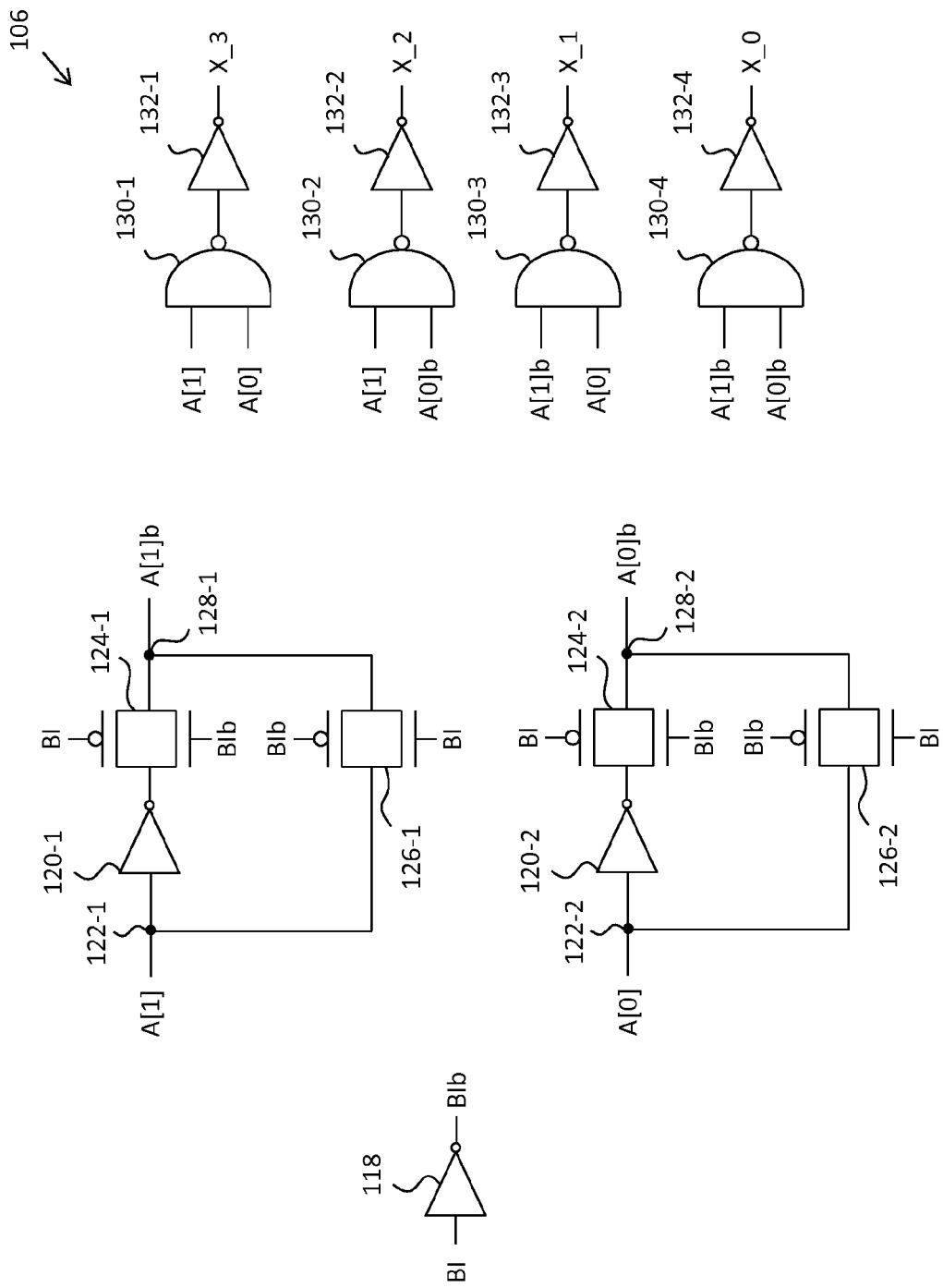
FIG. 2 is a block diagram of one example of a decoder in accordance with the semiconductor memory illustrated in FIG. 1.

FIG. 2 illustrates one example of a decoder 106, which may be implemented as a row decoder 106-1 and/or as a column decoder 106-2, in accordance with semiconductor memory 100 illustrated in FIG. 1. In the embodiment illustrated in FIG. 2, the illustrated decoder 106 is a 2-to-4 decoder; however, one skilled in the art will understand that decoder 106 may be implemented to decode other combinations of inputs and outputs. In the embodiment illustrated in FIG. 2, decoder 106 includes an inverter 118 configured to receive the burn-in test signal, BI, and generates its complement, BIb, which is supplied to other circuits of decoder 106.

An inverter 120-1 has an input coupled to node 1220-1, which is coupled to receive a bit, A[1], of a multi-bit address. The multi-bit address received by inverter 120-1 may be a bit of multi-bit address Col_Add or Row_Add depending on whether decoder 106 is implemented as the column decoder 106-2 or the row decoder 106-1. A second pass gate 126-1 is coupled in parallel with pass gate 124-1 and has its input coupled to inverter 120-1. The outputs of pass gates 124-1 and 126-1 are coupled together at node 128-1.

The opening and closing of pass gate 124-1 is controlled by signal BI and its complement BIb. Pass gate 126-1 is also configured to open and close in response to receiving signal BI and its complement BIb. Pass gates 124-1 and 126-1 are configured such that pass gate 124-1 couples the signal at node 122-1 to node 128-1 when pass gate 126-1 is open or in an off state, and pass gate 126-1 couples the signal at node 122-1 to node 128-1 when pass gate 124-1 is open or in an off state. Node 128-1 outputs an intermediate address signal A[1]b, which is based on the input of inverter 120-1.

Another inverter 120-2 has its input coupled to node 122-2, which is coupled to receive another bit, A[0], of a multi-bit row or column address. The output of inverter 120-2 is coupled to an input of pass gate 124-2. Pass gate 126-2 is disposed in parallel with pass gate 124-2 and has its input coupled to node 122-2. The outputs of pass gates 124-2 and 126-2 are coupled to node 128-2, which is configured to output an intermediate address signal A[0]b based on the input to inverter 120-2. Pass gates 124-2 and 126-2 are configured such that pass gate 124-2 is not closed or in an on state when pass gate 126-2 is closed or in an on state. For example, when pass gate 124-2 is closed such that the signal at node 122-2 is coupled to node 128-2 through pass gate 124-2, then pass gate 126-2 is open such that node 122-2 is not coupled to node 128-2 through pass gate 126-2 and vice versa.

Decoder 106 also includes a plurality of logic gates 130, which are illustrated as NAND gates. One skilled in the art will understand that logic gates 130 may implemented as other types of logic gates including, but not limited to, NOR gates, AND gates, and OR gates, to name a few possibilities. Logic gate 130-1 includes a first input coupled to receive address signal A[0], which is also received at node 122-2, and a second input coupled to receive address signal A[1], which is also received at node 122-1. The output of logic gate 130-1 is coupled to an inverter 132-1, which outputs decoded address signal X_3.

Logic gate 130-2 has a first input coupled to receive input signal A[1], which is also received at node 122-1, and to receive intermediate address signal A[0]b from node 128-2. The output of logic gate 130-2 is coupled to an input of inverter 132-2, which outputs decoded address signal X_2.

The intermediate address signal A[1]b from node 128-1 is received at one of the inputs of logic gate 130-3, which receives address signal A[0] at its other input. The output of logic gate 130-3 is coupled to an input of inverter 130-3, which outputs decoded address signal X_1. Logic gate 130-4 is coupled to receive intermediate address signal A[1]b, which is output from node 128-1, at a first input and to receive intermediate address signal A[0]b from node 128-2 at a second input. The output of logic gate 130-4 is coupled to inverter 132-4, which outputs decoded address X_0.

In a normal operating mode, i.e., a non-testing mode, the burn-in test signal, BI, is set at a logic zero or low. With the BI signal low, the output of inverter 118, which is the BIb signal, is a logic one or high. Pass gates 124-1 and 124-2 are both turned on in response to the BI signal being a logic low and the BIb signal being a logic high, and pass gates 126-1 and 126-2 are both off when the BI signal is a logic low and the BIb signal is a logic high.

The address bits, A[0], A[1], etc. correspond to one of the Ext_Col_Add or the Ext_Row_Add signals received from an external device, such as a memory controller. The decoded address signals X_0, X_1, X_2, and X_3 are based on address signals A[0] and A[1], which may be individually be set to a logic zero or one. Signal A[0]b will be of the opposite logic value as signal A[0] due to pass gate 126-2 being off and pass gate 124-2 being on such that signal A[0] is inverted by inverter 120-2 and coupled to node 128-2. Similarly, signal A[1]b will be of the opposite logic value as signal A[1] due to pass gate 126-1 being off and pass gate 124-1 being on such that signal A[0] is inverted by inverter 120-1 and coupled to node 128-1.

In a testing mode, the BI signal is set to a logic one resulting in complementary signal BIb, which is output from inverter 118, being a logic zero. With BI high and BIb low, pass gates 124-1 and 124-2 are off and pass gates 126-1 and 126-2 are on. Address signals A[0] and A[1] are based on the Test_Col_Add or Test_Row_Add signals output from test controller 110. In some embodiments, controller 110 may set each of the address bits, e.g., A[0], A[1], etc., to logic ones, although one skilled in the art will understand that the address bits may be set to other combinations of logic ones and zeroes. The address bits from controller 110 are not passed through inverters 120, but instead pass through pass gates 126 such that the signals received at nodes 128, e.g., A[0]b, A[1]b, etc., have the same logic value as the address bits from controller 110.

In embodiments in which address bits received from controller 110 are all logic ones as are their respective complements at nodes 128, the decoded address signals, e.g., X_0, X_1, X_2, and X_3, are all logic ones. For example, logic gate 130-1 outputs a logic zero when its inputs, i.e., A[0] and A[1], are logic ones. The logic zero output by logic gate 130-1 is inverted by inverter 132-1 such that decoded address X_3 is a logic one. In a similar manner, logic gate 130-2 outputs a logic zero to the input of inverter 132-2 in response to its inputs, i.e., A[0]b and A[1], being logic ones. Inverter 132-2 outputs a logic one in response to receiving a logic zero at its input. Logic gates 130-3 and 130-4 and inverters 132-3 and 132-4 operate in a similar manner such that decoded addresses X_1 and X-0 are logic ones.

Figures 3, 4:
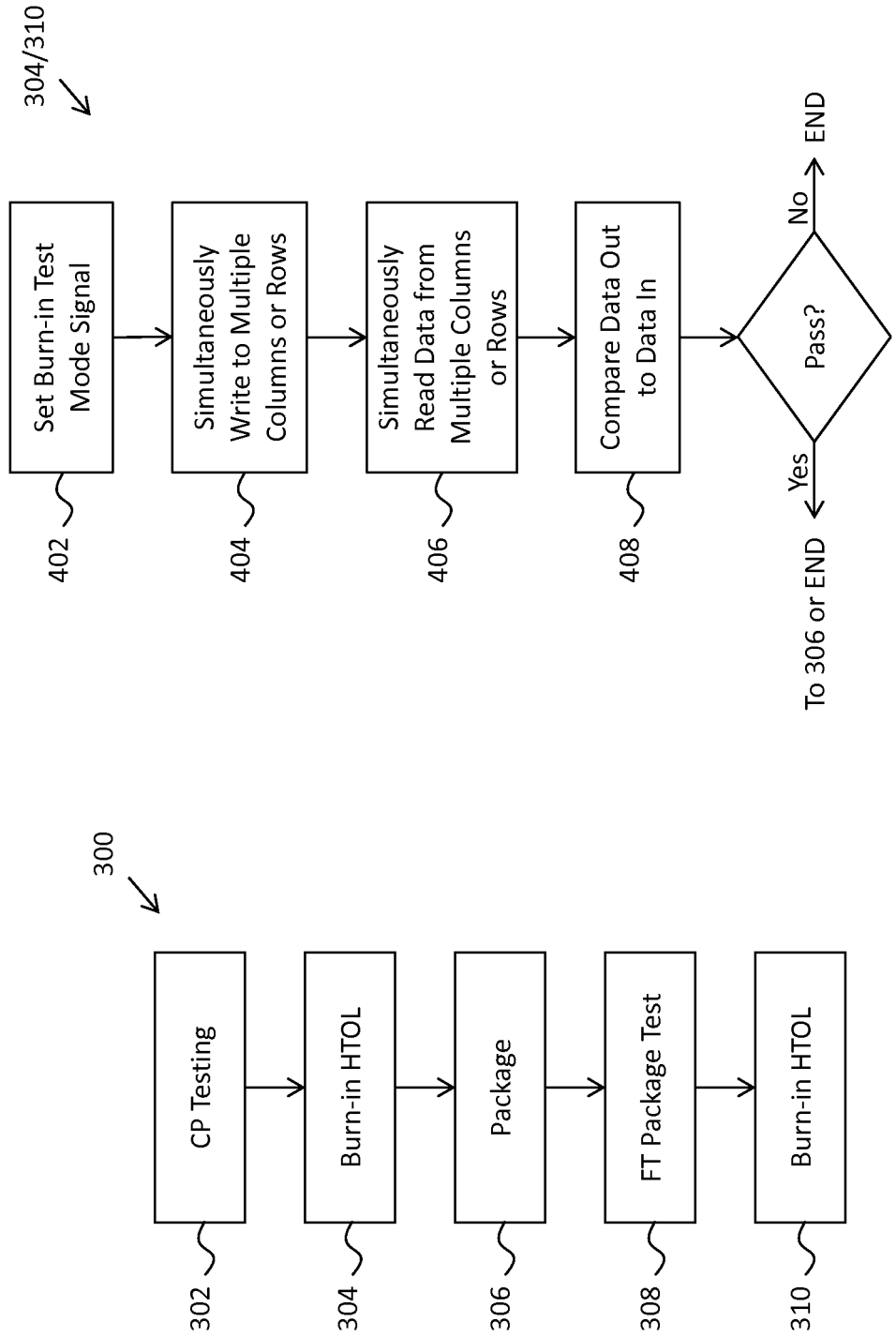
FIG. 3 is a flow diagram of one example of an improved method of testing a semiconductor memory.
FIG. 4 is a flow diagram of one example of an improved burn-in HTOL testing method in accordance with the testing method illustrated in FIG. 3.

The operation of decoder 106, which provides for one or more columns and/or rows of bit cells to be turned simultaneously, advantageously enables faster burn-in testing during wafer testing and packaging. FIG. 3 is a flow diagram of one example of an improved testing method 300 of a semiconductor memory that may be used in accordance with the improved semiconductor memory illustrated in FIGS. 1 and 2.

At block 302, a circuit probe ("CP") test is performed. As will be understood by one skilled in the art, a CP test is performed on a semiconductor wafer using a wafer probe (not shown). As will be understood by one skilled in the art, a CP test may include applying a read enable signal or a write enable signal to a test chip wafer. The data are written to and read from the test chip and the CP test device compares the data input to the data output from the test chip to determine if the test chip includes errors.

If the wafer passes the CP test, then a burn-in high-temperature operating life ("HTOL") test is performed at block 304. Burn-in tests are performed to identify and eliminate devices having inherent defects or defects that result from manufacturing aberrations causing time and stress depending failures. HTOL testing is used to determine the reliability of devices when operating at high temperature conditions for an extended period of time. One example of an improved burn-in HTOL testing method 304 is illustrated in FIG. 4.

As shown in FIG. 4, the burn-in HTOL test begins with the test mode signal, BI, being set by signal generator 116 at block 402. In some embodiments, signal generator 116 outputs the test signal BI in response to receiving a signal from an external circuit (not shown). The test signal BI is provided to muxes 114, 116 and to column decoder 106-1 and to row decoder 106-2 as described above.

At block 404, data are written to at least one of multiple columns or rows of bit cells 105. The addresses for the writing of data to bit cells 105 are generated by test controller 110. As described above, controller 110 outputs test column addresses, Test_Col_Add, and test row addresses, Test_Row_Add, to mux 112 and to mux 114, respectively. Mux 112 outputs Col_Add to column decoder 106-2 in response to receiving test signal BI from signal generator 116 and Test_Col_Add from controller 110. Mux 114 outputs Row_Add to row decoder 106-1 in response to receiving test signal BI from signal generator 116 and Test_Row_Add from controller 110.

Decoders 106 respectively receive Col_Add, which is based on Test_Col_Add, or Row_Add, which is based on Test_Row_Add, and generate decoded address signals in response. As described above, the BI signal is set to a logic one resulting in complementary signal BIb, which is output from inverter 118, being a logic zero. With BI high and BIb low, pass gates 124-1 and 124-2 are off and pass gates 126-1 and 126-2 are on. In some embodiments, each of the address bits, e.g., A[0], A[1], etc., are set to logic ones and are passed through inverters 120 and pass gates 126 such that the signals received at nodes 128, e.g., A[0]b, A[1]b, etc., have the same logic value as the address bits from controller 110.

In embodiments in which address bits received from controller 110 are all logic ones as are their respective complements at nodes 128, the decoded address signals, e.g., X_0, X_1, X_2, and X_3, are all logic ones. For example, logic gate 130-1 outputs a logic zero when its inputs, i.e., A[0] and A[1], are logic ones. The logic zero output by logic gate 130-1 is inverted by inverter 132-1 such that decoded address X_3 is a logic one. In a similar manner, logic gate 130-2 outputs a logic zero to the input of inverter 132-2 in response to its inputs, i.e., A[0]b and A[1], being logic ones. Inverter 132-2 outputs a logic one in response to receiving a logic zero at its input. Logic gates 130-3 and 130-4 and inverters 132-3 and 132-4 operate in a similar manner such that decoded addresses X_1 and X-0 are logic ones.

Write drivers in block 108 are used to write data to memory bit cells 105 based on the decoded addresses as will be understood by one skilled in the art. In this manner, built-in test circuit 102 may write data to one or more rows and/or columns of memory array 104 simultaneously.

At block 406, data is read from bit cells 105 of array 104. As will be understood by one skilled in the art, the reading of data from bit cells 105 includes activating one or more bit cells identified by decoded addresses and sensing the voltage that develops on a bit line. The addresses for reading data from bit cells 105 may be generated by test controller 110 in a manner similar to manner in which the addresses are generated for writing data to bit cells 105.

For example, controller 110 outputs test column addresses, Test_Col_Add, and test row addresses, Test_Row_Add, to mux 112 and to mux 114, respectively. Mux 112 outputs Col_Add to column decoder 106-2 in response to receiving test signal BI from signal generator 116 and Test_Col_Add from controller 110. Mux 114 outputs Row_Add to row decoder 106-1 in response to receiving test signal BI from signal generator 116 and Test_Row_Add from controller 110.

Row decoder 106-1 receives Row_Add from mux 114, and column decoders 106-2 receives Col_Add from mux 112. Row decoder 106-2 generates decoded addresses in response to receiving Row_Add, which is based on Test_Row_Add, from mux 114. Column decoder 106-1 generates decoded addresses in response to receiving Col_Add, which is based on Test_Col_Add, from mux 112.

As described above, the BI signal is set to a logic one resulting in complementary signal BIb, which is output from inverter 118, being a logic zero. With BI high and BIb low, pass gates 124-1 and 124-2 are off and pass gates 126-1 and 126-2 are on. In some embodiments, each of the address bits, e.g., A[0], A[1], etc., are set to logic ones and are passed through inverters 120 and pass gates 126 such that the signals received at nodes 128, e.g., A[0]b, A[1]b, etc., have the same logic value as the address bits from controller 110.

In embodiments in which address bits received from controller 110 are all logic ones as are their respective complements at nodes 128, the decoded address signals, e.g., X_0, X_1, X_2, and X_3, are all logic ones. For example, logic gate 130-1 outputs a logic zero when its inputs, i.e., A[0] and A[1], are logic ones. The logic zero output by logic gate 130-1 is inverted by inverter 132-1 such that decoded address X_3 is a logic one. In a similar manner, logic gate 130-2 outputs a logic zero to the input of inverter 132-2 in response to its inputs, i.e., A[0]b and A[1], being logic ones. Inverter 132-2 outputs a logic one in response to receiving a logic zero at its input. Logic gates 130-3 and 130-4 and inverters 132-3 and 132-4 operate in a similar manner such that decoded addresses X_1 and X-0 are logic ones.

Sense amplifiers in block 108 are used to sense data that develops on bit lines coupled to memory bit cells 105 based on the decoded addresses as will be understood by one skilled in the art. In this manner, built-in test circuit 102 may read data to one or more rows and/or columns of memory array 104 simultaneously. The writing data to and reading data from bit cells 105 performed at block 404 and 406 may be performed for an extended period and at a high temperature to determine stead-state life of semiconductor 100. In some embodiments, the burn-in HTOL test is performed for less than or equal one hour in an ambient temperature at or above 85° C. In some embodiments, the burn-in HTOL test is performed in ambient temperatures between 85° C. and 150° C., although one skilled in the art will understand that a burn-in HTOL test may be performed in other ambient temperature ranges and for other durations.

At block 408, the data read from bit cells 105 of array 104 are compared to the data written to bit cells 105 of array 104. As will be understood by one skilled in the art, an external wafer test device may be used to provide the test data to semiconductor array 100. The external wafer test device may also be configured to compare the data output from semiconductor memory 100 to the data written to semiconductor memory 100.

At decision block 410, a determination is made as to whether the wafer passed the burn-in HTOL test. In some embodiments, if a number of read/write failures is greater than a threshold value, then the wafer fails the burn-in HTOL test and method 300 is terminated. If the number of read/write failures is below a threshold value, then the wafer passes the burn-in HTOL test and method 300 proceeds to block 306.

Referring again to FIG. 3, the semiconductor memory 100 is packaged at block 306. The packaging at block 306 may include connecting die pads to pins on a package. The packaging of semiconductor memory 300 may further include attaching multiple chips together by bonding, encapsulating one or more chips, or other packaging processes.

At block 308, a final test ("FT") is performed once semiconductor memory 100 has been packaged. The FT test of the package may include writing data to and reading data from semiconductor memory. The FT test is performed to identify if the integrated circuit was damaged during the packaging process.

At block 310, a second burn-in HTOL test is performed if the packaged semiconductor memory 100 passes the FT package test at block 308. The burn-in HTOL test performed at block 310 may use the same steps used at block 304 and is illustrated in FIG. 4. If a number of read/write failures during the burn-in HTOL test 310 is greater than a threshold value, then the wafer fails the burn-in HTOL test and method 300 is terminated. If the number of read/write failures is below a threshold value, then the wafer passes the burn-in HTOL test at block 310 and method 300 ends. In some embodiments, the burn-in HTOL tests performed at block 304 and 310 may last for a period of time that is less than or equal to one hour, although one skilled in the art will understand that burn-in HTOL process 304/310 may last for other durations.

The improved semiconductor memory 100 and testing method 300 described herein advantageously provides for data comparison during a burn-in HTOL process. Additionally, the improved semiconductor memory and method advantageously enable reduce the amount of time required for testing by enabling multiple rows and columns to be simultaneously tested.

In some embodiments, a method of testing a semiconductor memory includes performing a first test of a first type prior to packaging the semiconductor memory. The first test of the first type includes generating a first plurality of addresses, decoding the first plurality of addresses to generate a second plurality of decoded addresses at a first decoder, and activating one of a plurality of rows or a plurality of columns of the semiconductor memory based on the second plurality of decoded addresses. The semiconductor memory is packaged after performing the first test of the first type.

In some embodiments, a testing method includes performing a first test of a first type prior to packaging a semiconductor memory. The first test of the first type includes decoding a first plurality of addresses to generate a first plurality of decoded addresses at a first decoder, decoding a second plurality of addresses to generate a second plurality of decoded addresses at a second decoder, and writing data to a plurality of bit cells based on the first and second plurality of decoded addresses. Data are from the plurality of bit cells and compared to the data written to the plurality of bit cells. The semiconductor memory is packaged after performing the first test of the first type if a number of failures identified by the first test of the first type is below a threshold value.

In some embodiments, a testing method performing a first test of a first type. The first test of the first type includes generating a plurality of test row addresses and a plurality of test column addresses, decoding the row addresses at a row decoder to generate a plurality of decoded row addresses, and decoding the column plurality of addresses at a column decoder to generate a plurality of decoded column addresses. Data are written to a plurality of bit cells based on the decoded row and column addresses. Data are read from the plurality of bit cells and compared to the data written to the plurality of bit cells. The semiconductor memory is packaged after performing the first test of the first type if a number of failures identified by the first test of the first type is below a threshold value.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of testing a semiconductor memory, comprising:
    performing a first test of a first type prior to packaging the semiconductor memory, the first test of the first type including:
        generating a first plurality of addresses,
        decoding the first plurality of addresses to generate a second plurality of decoded addresses at a first decoder, and
        activating one of a plurality of rows or a plurality of columns of the semiconductor memory based on the second plurality of decoded addresses; and
    packaging the semiconductor memory after performing the first test of the first type.

2. The method of claim 1, wherein the first decoder is one of a row decoder and a column decoder.

3. The method of claim 1, wherein the first test of the first type includes:
    generating a third plurality of addresses,
    decoding the third plurality of addresses to generate a second plurality of decoded addresses at a second decoder, and
    activating one of a plurality of rows or a plurality of columns of the semiconductor memory based on the fourth plurality of decoded addresses.

4. The method of claim 3, wherein the first decoder is a row decoder and the second decoder is a column decoder.

5. The method of claim 3, further comprising performing a second test of a first type after packaging the semiconductor memory, the second test of the first type including:
    generating a fifth plurality of addresses,
    decoding the fifth plurality of addresses to generate a sixth plurality of decoded addresses at the first decoder, and
    activating one of a plurality of rows or a plurality of columns of the semiconductor memory based on the sixth plurality of decoded addresses.

6. The method of claim 5, wherein the second test of the first type includes:
    generating a seventh plurality of addresses,
    decoding the seventh plurality of addresses to generate an eighth plurality of decoded addresses at the second decoder, and
    activating one of a plurality of rows or a plurality of columns of the semiconductor memory based on the eighth plurality of decoded addresses.

7. The method of claim 6, wherein the first decoder is a row decoder and the second decoder is a column decoder.

8. The method of claim 1, further comprising:
    performing a first test of a second type prior to packaging the semiconductor memory; and
    performing a first test of a third type after packaging the semiconductor memory.

9. The method of claim 8, wherein the first test of the second type is a circuit probe test and the first test of the third type is a final test.

10. The method of claim 1, wherein activating one of a plurality of rows or a plurality of columns of the semiconductor memory includes one of writing data to or reading data from bit cells of the semiconductor memory.

11. A testing method, comprising:
    performing a first test of a first type prior to packaging a semiconductor memory, the first test of the first type including:
        decoding a first plurality of addresses to generate a first plurality of decoded addresses at a first decoder,
        decoding a second plurality of addresses to generate a second plurality of decoded addresses at a second decoder,
        writing data to a plurality of bit cells based on the first and second plurality of decoded addresses,
        reading data from the plurality of bit cells,
        comparing the data read from the plurality of bit cells to the data written to the plurality of bit cells; and
    packaging the semiconductor memory after performing the first test of the first type if a number of failures identified by the first test of the first type is below a threshold value.

12. The method of claim 11, wherein the first decoder is a row decoder and the second decoder is a column decoder.

13. The method of claim 11, further comprising:
performing a first test of a second type prior to packaging the semiconductor memory; and
performing a first test of a third type after packaging the semiconductor memory.

14. The method of claim 13, wherein the first test of the second type is a circuit probe test and the first test of the third type is a final test.

15. The method of claim 11, wherein the first plurality of addresses are received from a first multiplexer and the second plurality of addresses are received from a second multiplexer.

16. The method of claim 15, further comprising:
generating the first and second plurality of addresses;
outputting the first plurality of addresses to the first multiplexer; and
outputting the second plurality of addresses to the second multiplexer.

17. The method of claim 16, further comprising:
outputting the first plurality of addresses from the first multiplexer to the first decoder in response to receiving a test mode signal; and
outputting the second plurality of addresses from the second multiplexer to the second decoder in response to receiving the test mode signal.

18. A testing method, comprising:
performing a first test of a first type including:
generating a plurality of test row addresses and a plurality of test column addresses,
decoding the row addresses at a row decoder to generate a plurality of decoded row addresses,
decoding the column plurality of addresses at a column decoder to generate a plurality of decoded column addresses,
writing data to a plurality of bit cells based on the decoded row and column addresses,
reading data from the plurality of bit cells,
comparing the data read from the plurality of bit cells to the data written to the plurality of bit cells; and
packaging the semiconductor memory after performing the first test of the first type if a number of failures identified by the first test of the first type is below a threshold value.

19. The method of claim 18, further comprising:
performing a first test of a second type prior to packaging the semiconductor memory; and
performing a first test of a third type after packaging the semiconductor memory.

20. The method of claim 19, wherein the first test of the second type is a circuit probe test and the first test of the third type is a final test.

* * * * *